United States Patent
Hall et al.

(10) Patent No.: US 10,435,325 B2
(45) Date of Patent: Oct. 8, 2019

(54) MOLDS WITH COATINGS FOR HIGH TEMPERATURE USE IN SHAPING GLASS-BASED MATERIAL

(71) Applicant: CORNING INCORPORATED, Corning, NY (US)

(72) Inventors: Jill Marie Hall, Campbell, NY (US); Ljerka Ukrainczyk, Painted Post, NY (US)

(73) Assignee: CORNING INCORPORATED, Corning, NY (US)

( * ) Notice: Subject to any disclaimer, the term of this patent is extended or adjusted under 35 U.S.C. 154(b) by 287 days.

(21) Appl. No.: 15/410,019

(22) Filed: Jan. 19, 2017

(65) Prior Publication Data

US 2017/0203992 A1 Jul. 20, 2017

Related U.S. Application Data

(60) Provisional application No. 62/280,885, filed on Jan. 20, 2016.

(51) Int. Cl.
*C03B 23/035* (2006.01)
*C23C 14/06* (2006.01)
(Continued)

(52) U.S. Cl.
CPC ........ *C03B 23/0357* (2013.01); *C03B 11/086* (2013.01); *C03B 23/02* (2013.01); *C03B 40/00* (2013.01); *C23C 14/0084* (2013.01); *C23C 14/0641* (2013.01); *C23C 14/165* (2013.01); *C23C 14/3464* (2013.01); *C23C 14/3492* (2013.01); *C03B 2215/11* (2013.01);
(Continued)

(58) Field of Classification Search
CPC ............. C03B 2215/11; C03B 2215/16; C03B 2215/26; C03B 2215/30; C03B 23/02; C03B 11/086; C03B 23/0357; C23C 14/0084; C23C 14/3492
See application file for complete search history.

(56) References Cited

U.S. PATENT DOCUMENTS

| | | | | |
|---|---|---|---|---|
| 4,747,864 A | * | 5/1988 | Hagerty | ............. C03B 11/086 65/102 |
| 5,223,350 A | * | 6/1993 | Kobayashi | ............. C03B 11/084 106/38.9 |

(Continued)

OTHER PUBLICATIONS

International Search Report and Written Opinion PCT/US2017/014009 dated Apr. 26, 2017.
(Continued)

*Primary Examiner* — Joseph S Del Sole
*Assistant Examiner* — Emmanuel S Luk
(74) *Attorney, Agent, or Firm* — Timothy M. Schaeberle

(57) ABSTRACT

A mold with a multi-layer coating is disclosed. The mold may include a mold body having an outer surface and a multi-layer coating disposed on the outer surface. The multi-layer coating may include a diffusion barrier layer disposed on the outer surface of the mold body and an intermetallic layer disposed on the diffusion barrier layer, wherein the intermetallic layer comprises Ti, Al, and an additional metal selected from the group consisting of Zr, Ta, Nb, Y, Mo, Hf, and combinations thereof. The diffusion barrier layer may restrict diffusion of metal from the mold body to the intermetallic layer.

13 Claims, 16 Drawing Sheets

(51) Int. Cl.
*C03B 40/00* (2006.01)
*C03B 11/08* (2006.01)
*C03B 23/02* (2006.01)
*C23C 14/00* (2006.01)
*C23C 14/16* (2006.01)
*C23C 14/34* (2006.01)

(52) U.S. Cl.
CPC ...... *C03B 2215/16* (2013.01); *C03B 2215/26* (2013.01); *C03B 2215/30* (2013.01); *Y02P 40/57* (2015.11)

(56) References Cited

U.S. PATENT DOCUMENTS

| | | | |
|---|---|---|---|
| 5,405,652 A | 4/1995 | Kashiwagi et al. | |
| 5,538,528 A | 7/1996 | Kashiwagi et al. | |
| 5,741,604 A * | 4/1998 | Deakin | C23C 14/16 148/525 |
| 6,119,485 A | 9/2000 | Hibino et al. | |
| 6,455,167 B1 | 9/2002 | Rigney et al. | |
| 8,887,532 B2 | 11/2014 | Feng et al. | |
| 2004/0051026 A1* | 3/2004 | Flynn | B29C 33/38 249/116 |
| 2004/0211221 A1* | 10/2004 | Chen | C03B 11/086 65/374.11 |
| 2005/0144982 A1* | 7/2005 | Pai | C03B 11/086 65/169 |
| 2006/0037363 A1 | 2/2006 | Wang et al. | |
| 2006/0112730 A1* | 6/2006 | Chen | C03B 11/086 65/374.11 |
| 2007/0017254 A1* | 1/2007 | Yen | C03B 11/086 65/374.12 |
| 2008/0100915 A1* | 5/2008 | Wu | C23C 14/022 359/589 |
| 2010/0068556 A1 | 3/2010 | Lemmon et al. | |
| 2010/0101276 A1* | 4/2010 | Fukumoto | B44B 5/026 65/66 |
| 2011/0023546 A1* | 2/2011 | Hayamizu | C03B 11/086 65/83 |
| 2011/0256807 A1 | 10/2011 | Feng et al. | |
| 2012/0003425 A1* | 1/2012 | Brahmandam | C03B 11/086 428/141 |
| 2012/0047953 A1* | 3/2012 | Feng | C03B 11/086 65/102 |
| 2013/0125590 A1* | 5/2013 | Feng | C03B 11/086 65/122 |
| 2014/0224958 A1 | 8/2014 | Feng et al. | |
| 2014/0308528 A1 | 10/2014 | Ding et al. | |
| 2015/0052950 A1 | 2/2015 | Feng et al. | |
| 2016/0130704 A1* | 5/2016 | Schloffer | C23C 14/025 428/610 |

OTHER PUBLICATIONS

A.Tomsia, F.Zhang and J. Pask, J.Am Ceram. Soc. V68, 1985.
Y. Shinata, NaCl-Induced Hot Corrosion of Stainless Steels, Materials Sci. Eng, v87, 1987.
Y. Shinata and Y.Nishi, NaCl-Induced Accelerated Oxidation of Chromium, Oxidation of Metals, v26, 1986.
M. Hock, E. Schaffer, W. Doll, G. Kleer, Composite Coating Materials for the Moulding of Diffractive and Refractive Optical Components of Inorganic Glasses, Surface and Coating Technology, 163-164 (2003), p. 689-694.
G. Kleer, E. Kaiser and W. Doll, Behaviour of Ti—Al—N Coatings for Tools Applied in the Thermoplastic Moulding of Inorganic Glasses, Surface and coating technology, 79, (1996), p. 95.
H.H.Chien, W.H.Chuan, C.L.Chao, K.C.Hwang, Design of Protective Coatings for Glass Lens Molding, Key Engineering Materials, 364-366 II (2008), p. 655.
Hyun-Uk. Kim, Hye-Jeong Kim, Jeong-Ho, Kim, Re—Ir Coating Effect of Molding Core (WC) Surface for Aspheric Glass Lens, Proceedings of SPIE Micro-Nano Device and Components III, (2007), p. 671708.
P. Manns, W. Doll and G. Kleer, Glass in Contact with Mould Materials for Container Production. Glastech. Ber. Glass Sci. Technol. 68 (1995). 12.
H. B. Raval, P. M. Bhatt, and H N Shah, International Journal for Technological Research in Engineering, vol. 1, Issue 9, (2014) 2347-4718.
F. Appel, J. D. H. Paul, M. Oehring, Gamma Titanium Aluminide Alloys: Science and Technology, Chapter 12, pp. 433-447, Wiley 2011.

\* cited by examiner

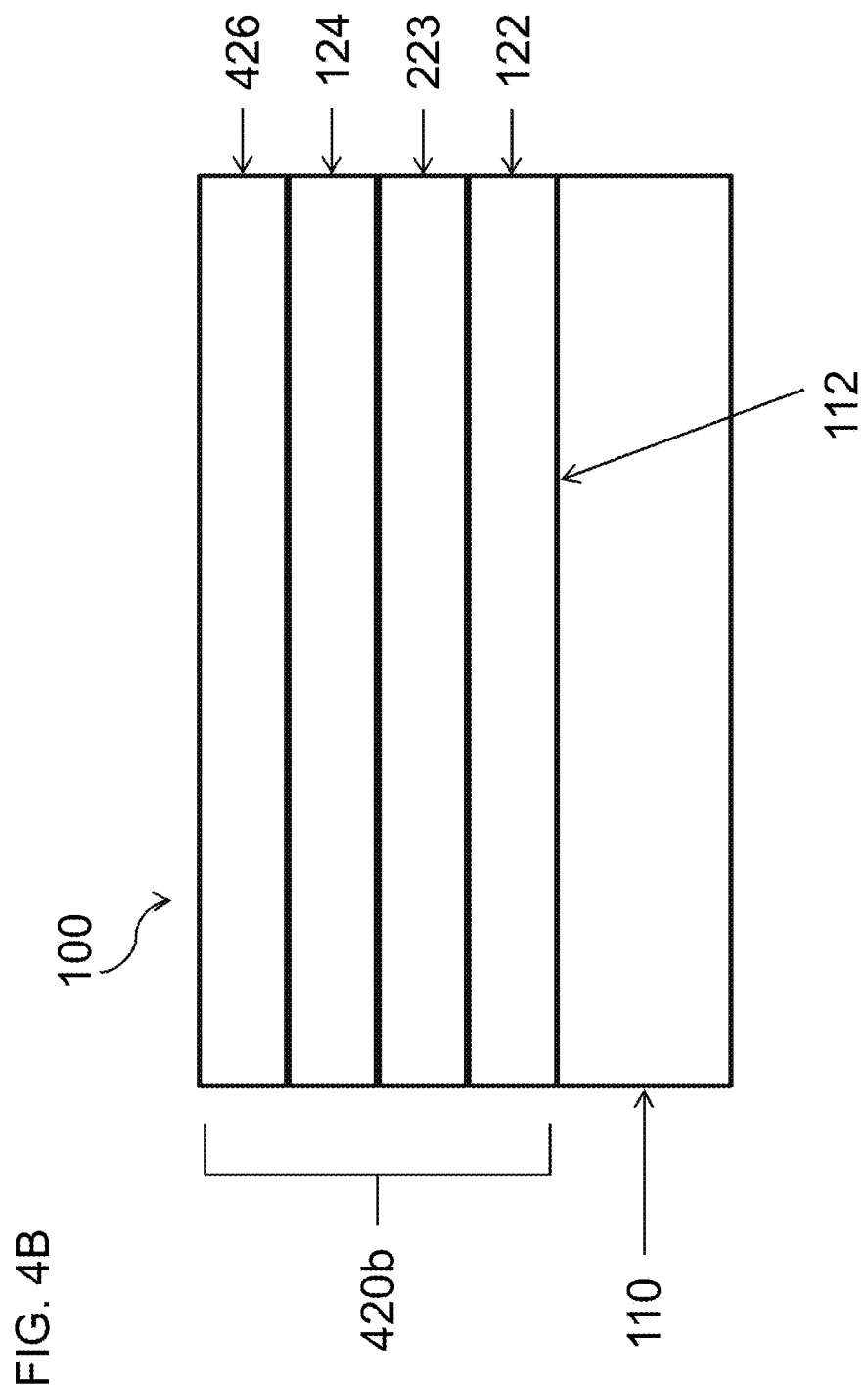

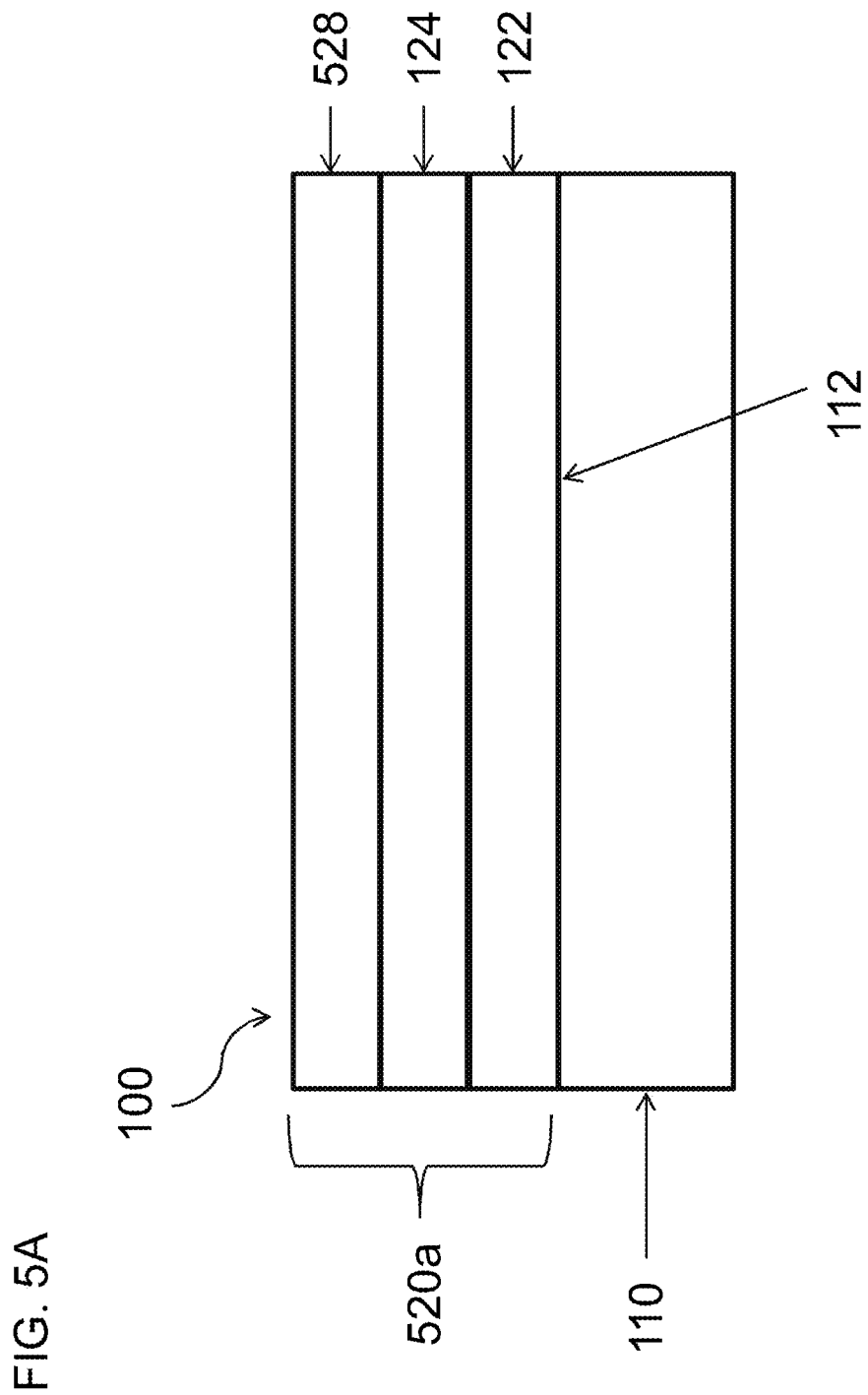

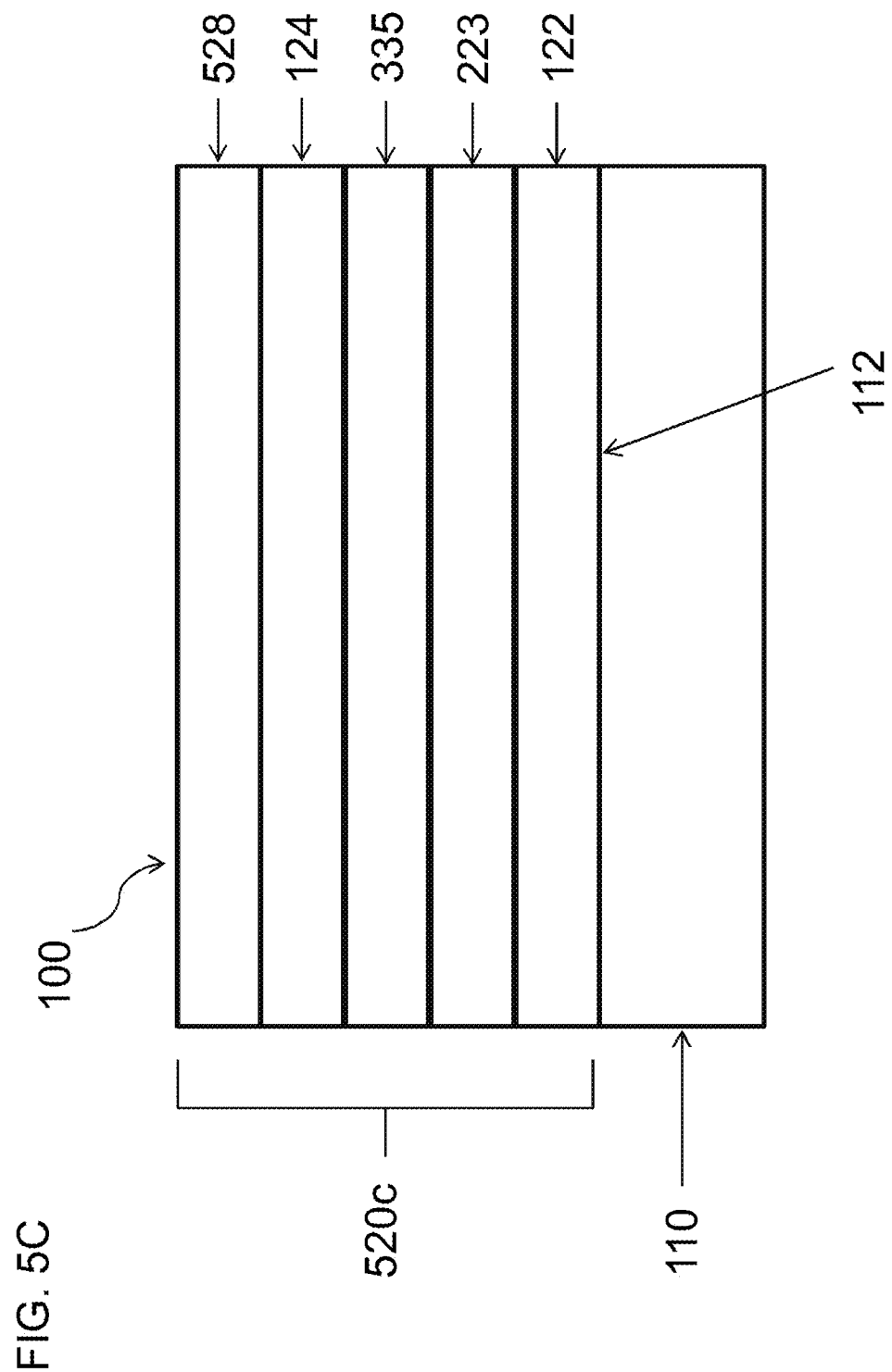

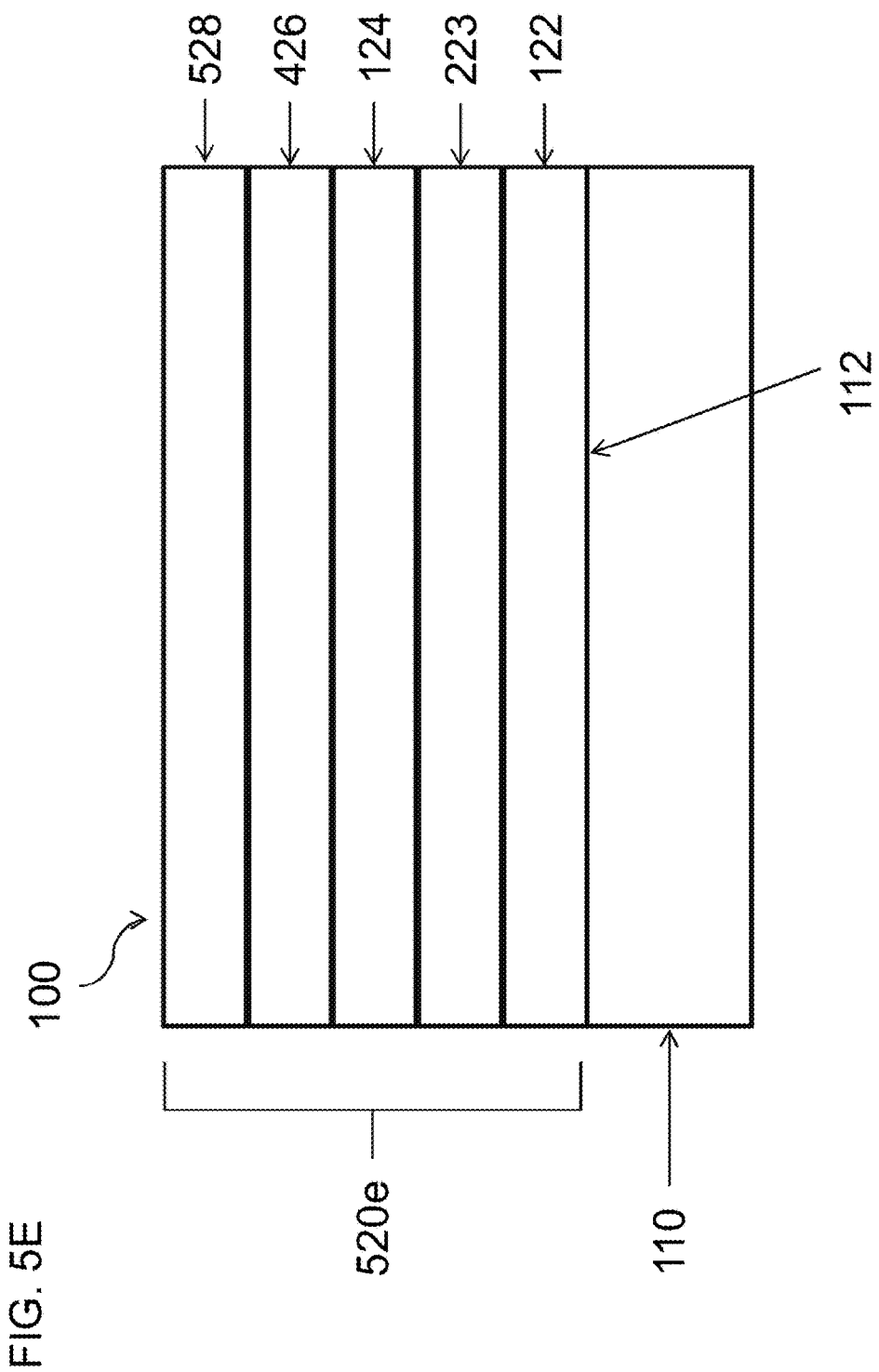

MOLDS WITH COATINGS FOR HIGH TEMPERATURE USE IN SHAPING GLASS-BASED MATERIAL

CROSS-REFERENCE TO RELATED APPLICATIONS

This application claims the benefit of priority under 35 U.S.C. § 119 of U.S. Provisional Application Ser. No. 62/280,885 filed on Jan. 20, 2016, the content of which is relied upon and incorporated herein by reference in its entirety.

BACKGROUND

Field

The present specification generally relates to molds for shaping glass-based material and, more specifically, molds having coatings for high temperature use in shaping glass-based material.

Technical Background

Glass articles can be formed into 3D shapes by heating the glass to a visco-elastic state and contacting the glass with a mold. However, forming three-dimensionally shaped glass articles with high softening point glass compositions, such as alkali aluminosilicate glass compositions, can be challenging. For example, some glass compositions have high softening points (sometimes greater than 900° C.), which makes a precision molding process more difficult since the glass needs to be heated to higher temperatures in order to reach a visco-elastic state suitable to forming. Additionally, some glass compositions have high percentages of sodium (such as, for example, greater than 10 mol %). Sodium may be highly mobile and reactive at high temperatures. Contacting a mold surface with sodium at high temperature may degrade the mold surface and, subsequently, the quality of the molded glass. Furthermore, pitting in the glass may be caused by particulate contaminants, such as contaminants from the mold. Pitting may also be caused by glass sticking to the mold surface where the glass to mold bond strength exceeds the strength of glass, creating divots in the glass due to so called "pullouts". Other cosmetic defects such as stains and/or scuffing may be observed on 3D molded glass surfaces, especially when using high forming temperatures and longer contact times.

Accordingly, a need exists for molds with coatings that are compatible with high temperatures when shaping glass-based material.

SUMMARY

In a first aspect a mold includes a mold body having an outer surface and a multi-layer coating disposed on the outer surface. The multi-layer coating includes a diffusion barrier layer disposed on the outer surface of the mold body and an intermetallic layer disposed on the diffusion barrier layer, wherein the intermetallic layer comprises Ti, Al, and an additional metal selected from the group consisting of Zr, Ta, Nb, Y, Mo, Hf, and combinations thereof. The diffusion barrier layer restricts diffusion of metal from the mold body to the intermetallic layer.

In a second aspect according to the first aspect, the multi-layer coating also includes a transition layer disposed between the diffusion barrier layer and the intermetallic layer, wherein the transition layer comprises a change in nitrogen content with a higher molar nitrogen content in a portion of the transition layer closest to the diffusion barrier layer and a lower molar nitrogen content in a portion of the transition layer closest to the intermetallic layer.

In a third aspect according to any preceeding aspect, the intermetallic layer comprises a change in the additional metal content with a lower molar content of the additional metal in a portion of the intermetallic layer closest to the diffusion barrier layer and a higher molar content of the additional metal in a portion of the intermetallic layer farthest from the diffusion barrier layer.

In a fourth aspect according to any preceeding aspect, the multi-layer coating also includes an oxidized intermetallic layer disposed on the intermetallic layer.

In a fifth aspect according to any preceeding aspect, the ratio of titanium molar content to aluminum molar content in the multi-layer coating is in a range from about 0.67 to about 1.

In a sixth aspect according to any one of the first through fourth aspects, the ratio of titanium molar content to aluminum molar content in the multi-layer coating is about 1.

In a seventh aspect according to any one of the first through fourth aspects, the ratio of titanium molar content to aluminum molar content in the multi-layer coating is greater than or equal to about 0.67 and less than about 1.

In an eighth aspect according to any preceeding aspect, a sum of the molar concentration of titanium and aluminum in the intermetallic layer is greater than or equal to the molar concentration of the additional metal in the intermetallic layer.

In a ninth aspect according to any one of the first through seventh aspects, the sum of the molar concentration of titanium and aluminum in the intermetallic layer is less than the molar concentration of the additional metal in the intermetallic layer.

In a tenth aspect according to any preceeding aspect, the multi-layer coating also includes a metal layer comprising the additional metal of the intermetallic layer disposed on the intermetallic layer.

In an eleventh aspect according to the tenth aspect, the intermetallic layer comprises a change in additional metal content with a lower molar content of the additional metal in a portion of the intermetallic layer closest to the diffusion barrier layer and a higher molar content of the additional metal in a portion of the intermetallic layer closest to the metal layer.

In a twelfth aspect according to the tenth or eleventh aspect, the multi-layer coating also includes an oxidized metal layer disposed on the metal layer.

In a thirteenth aspect according to any preceeding aspect, the additional metal is zirconium.

In a fourteenth aspect according to any preceeding aspect, the mold body is predominantly a metal selected from the group consisting of iron, nickel, chromium, copper, mixtures thereof, and alloys thereof.

Additional features and advantages of the embodiments described herein will be set forth in the detailed description which follows, and in part will be readily apparent to those skilled in the art from that description or recognized by practicing the embodiments described herein, including the detailed description which follows, the claims, as well as the appended drawings.

It is to be understood that both the foregoing general description and the following detailed description describe various embodiments and are intended to provide an overview or framework for understanding the nature and character of the claimed subject matter. The accompanying drawings are included to provide a further understanding of the various embodiments, and are incorporated into and constitute a part of this specification. The drawings illustrate the various embodiments described herein, and together with the description serve to explain the principles and operations of the claimed subject matter.

BRIEF DESCRIPTION OF THE DRAWINGS

Below is a brief description of the drawings. It is noted that the drawings are not to scale and are not intended to provide a comparison of the relative sizes of the various layers depicted in the drawings.

FIGS. 4A-4C schematically depict a cross sectional diagram of a multi-layer coating on a mold body, according to one or more embodiments shown and described herein;

FIGS. 5A-5F schematically depict a cross sectional diagram of a multi-layer coating on a mold body, according to one or more embodiments shown and described herein;

DETAILED DESCRIPTION

Figure 1:
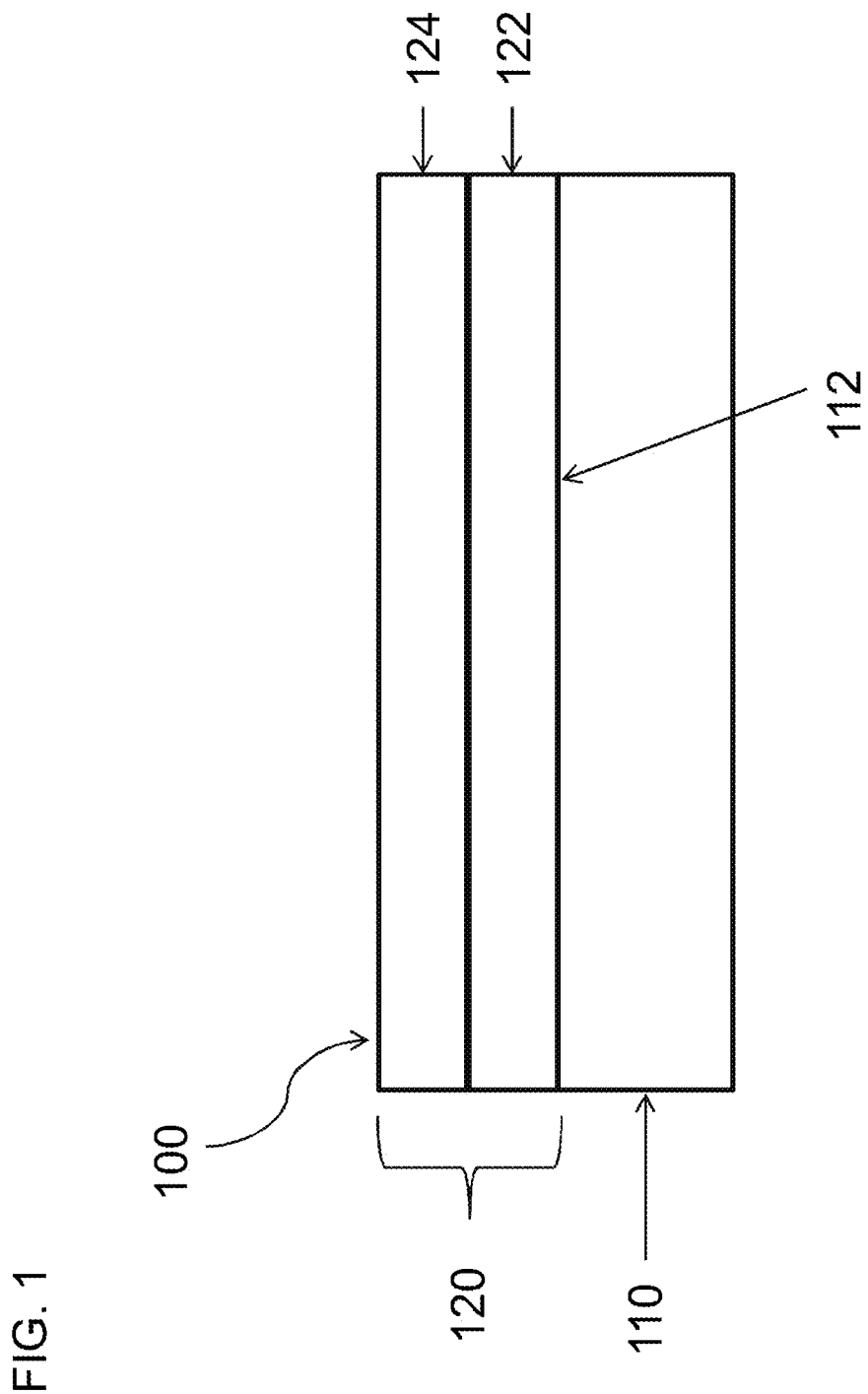
FIG. 1 schematically depicts a cross sectional diagram of a multi-layer coating on a mold body, according to one or more embodiments shown and described herein.

Reference will now be made in detail to various embodiments of molds having coatings for use in shaping glass-based materials, examples of which are illustrated in the accompanying drawings. Whenever possible, the same reference numerals will be used throughout the drawings to refer to the same or like parts.

The following description is provided as an enabling teaching. To this end, those skilled in the relevant art will recognize and appreciate that many changes can be made to the various embodiments described herein, while still obtaining the beneficial results. It will also be apparent that some of the desired benefits can be obtained by selecting some of the features without utilizing other features. Accordingly, those who work in the art will recognize that many modifications and adaptations to the present embodiments are possible and can even be desirable in certain circumstances and are a part of the present description. Thus, the following description is provided as illustrative and should not be construed as limiting.

In this specification and in the claims which follow, reference will be made to a number of terms which shall be defined to have the meanings detailed herein.

The term "about" references all terms in the range unless otherwise stated. For example, about 1, 2, or 3 is equivalent to about 1, about 2, or about 3, and further comprises from about 1-3, from about 1-2, and from about 2-3. Specific and preferred values disclosed for compositions, components, ingredients, additives, and like aspects, and ranges thereof, are for illustration only; they do not exclude other defined values or other values within defined ranges. The compositions and methods of the disclosure include those having any value or any combination of the values, specific values, more specific values, and preferred values described herein.

The indefinite article "a" or "an" and its corresponding definite article "the" as used herein means at least one, or one or more, unless specified otherwise As used herein, the term "glass-based" includes glass and glass-ceramic materials.

As used herein, the term "substrate" describes a glass-based sheet that may be formed into a three-dimensional structure.

Generally, disclosed herein are molds with a multi-layer coating for use in shaping glass-based materials. The molds may be used to shape a substantially flat glass-based substrate or sheet into a three-dimensional glass-based article. In some embodiments the mold may include a mold body having a surface and a multi-layer coating disposed on at least a portion of the outer surface. The surface of the mold body may have a three-dimensional surface profile corresponding to a desired three-dimensional shape for a glass-based article which is shaped against the mold. In some embodiments, more than one mold body may be utilized to form a glass-based article. For example, two mold bodies may make contact with opposite sides of a glass-based material. Accordingly, in a two-mold embodiment, each mold body may have a multi-layer coating disposed thereon. The multi-layer coatings described herein may increase the temperature resistance of the mold, provide a surface that reduces stickiness to the glass-based material, decrease surface roughness to minimize or prevent imprinting pits onto the glass-based material, providing wear resistance to scuffing, and/or increasing the life of the mold by preserving the underlying mold surface so that the mold coating to be stripped and recoated multiple times before the mold surface must be re-machined.

FIG. 1 depicts a partial cross-section view of an exemplary mold 100 having a mold body 110 with a surface 112 and a multi-layer coating 120 disposed on at least a portion of surface 112. For simplicity the partial cross-sectional view of mold 100 in FIG. 1 illustrates a flat portion of surface 112 of mold body 110. However, as noted above surface 112 of mold body 110 may have a three-dimensional surface profile corresponding to a desired three-dimensional shape for a glass-based article which is shaped against mold 100.

Mold 100 may be any suitable mold capable of shaping molten glass. Examples of molds include, but are not limited to, tools such as dies, or other manufacturing presses. Mold body 110 may include any metal or other material capable of withstanding high temperatures (for example, 760° C. to 900° C.), such as refractory metals, refractory ceramics, or the like. In some embodiments, mold body 110 may include any metal or other material with a high hardness, for example a Rockwell hardness of greater than 65B. A high hardness may reduce scuffing or abrading of the mold body from glass-based material over time and/or may provide resistance to glass chips or other contaminants embedding in the mold body, which could cause imprints on the surface of the shaped glass-based materials. In some embodiments mold body 110 may be a metal including, but not limited to, iron, nickel, chromium, and copper, as well as mixtures thereof and alloys thereof. In some embodiments, surface 112 of mold body 110 may predominantly include a metal selected from the group consisting of iron, nickel, chromium, copper, mixtures thereof, and alloys thereof. As used herein, "predominantly" means a metal, metal mixture or metal alloy wherein metals from the above group make up more than 50% by weight of the metal, mixture, or alloy. Illustrative examples include, but are not limited to, cast iron, steels or steel alloys such as H13, S7 and P20, stainless steels 309, 310 and 420, and nickel alloys such as Hastelloy® alloys (for example, Hastelloy® 214) and Inconel® alloys (for example, Inconel® 718 or Inconel® 600).

In some embodiments, multi-layer coating 120 may include a diffusion barrier layer 122 disposed on surface 112 of mold body 110 and an intermetallic layer 124 disposed on diffusion barrier layer 122. As used herein, the term "dispose" includes coating, depositing and/or forming a material onto a surface using any known method in the art. The phrase "disposed on" includes the instance of forming a material onto a surface such that the material is in direct contact with the surface and also includes the instance where the material is formed on a surface, with one or more intervening material(s) between the disposed material and the surface.

In some embodiments, diffusion barrier layer 122 may include a nitride, such as TiAlN, TiAlSiN, TiN, AlN, TiAlXN (where X may include a metal such as, but not limited to Nb, Zr, Y, Mo, or Hf) or combinations thereof. In some embodiments, diffusion barrier layer 122 may have a molar nitrogen content of greater than about 30%. The molar nitrogen content may be measured using an electron microprobe or using X-ray photoelectron spectrometry (XPS). Diffusion barrier layer 122 may restrict diffusion of metals from the mold body 110 to an outermost layer of the multi-layer coating. As noted herein, metals from the mold body 110, such as Ni or Cr, may be mobile at elevated temperatures, and their presence in the outermost layer of the multi-layer coating may cause defects, such as pitting. Additionally, diffusion barrier layer 122 may also restrict diffusion of glass materials that transfer to the outermost layer of mold 100 during shaping of a glass-based material from an outermost layer of mold 100 to mold body 110. Some glass materials, such as sodium, may cause corrosion in the material of the mold body 110. As the diffusion barrier layer 122 prevents and/or minimizes the diffusion of these species, the diffusion barrier layer 122 also prevents and/or minimizes defects caused by such species.

The diffusion barrier layer 122 may also prevent and/or minimize the formation of voids in the mold body 110 that are due to the outdiffusion of base metals into the multi-layer coating. Specifically, the diffusion barrier layer 122 prevents and/or minimizes the diffusion of base metals into or through the remainder of the multi-layer coating and, as a result, mitigates the formation of voids in the mold body 110 that are left by out-diffused metal. Since voids may form with less severity and/or frequency with a diffusion barrier layer 122, the diffusion barrier layer 122 may enable repeat stripping and recoating of molds, and extends the service life of the mold. In some embodiments, diffusion barrier layer 122 may have a thickness in a range from about 25 nm to about 2,000 nm, from about 100 nm to about 600 nm, from about 300 nm to about 500 nm, or from about 1,000 nm to about 2,000 nm.

In some embodiments, intermetallic layer 124 may include Ti, Al, and an additional metal selected from the group consisting of Zr, Ta, Nb, Y, Mo, Hf, and combinations thereof. As used herein, the term "intermetallic" means a material composed of two or more types of metal atoms, which exist as homogeneous, composite substances and differ discontinuously in structure from that of the constituent metals. The additional metal, which may be a refractory metal, may be included in intermetallic layer 124 because it may be less reactive with the glass-based materials that are shaped against the mold, and therefore, reduces sticking of the glass-based materials to the mold during shaping and provides a shaped glass-based material with better surface cosmetics. Also, the additional metal, which may be a refractory metal, may be included in intermetallic layer 124 because it may make the multi-layer coating more resistant to damage from high temperatures (for example, 760° C. to 900° C.), which the mold may need to withstand when forming glass-based materials having softening points at high temperatures.

In some embodiments the composition of intermetallic layer 124 may be modified based on the temperature is must withstand based on the softening point of the glass-based material to be shaped against the mold. Modification of the composition of intermetallic layer 124 may include modifying the weight percentage of the additional metal, the ratio of the molar concentration of Ti to the molar concentration of Al, and/or the relationship between the sum of the molar concentration of titanium and aluminum in the intermetallic layer and the molar concentration of the additional metal in the intermetallic layer. In some embodiments, intermetallic layer 124 may include the additional metal in a range from about 20 wt % to about 40 wt %, about 20 wt % to about 35 wt %, about 20 wt % to about 30 wt %, about 25 wt % to about 40 wt %, about 25 wt % to about 35 wt %, about 25 wt % to about 30 wt %, about 30 wt % to about 40 wt %, about 30 wt % to about 35 wt %, or about 35 wt % to about 40 wt %. The weight percentage may be measured using an electron microprobe, XPS, or secondary-ion mass spectroscopy (SIMS). In some embodiments, the ratio of the molar concentration of Ti to the molar concentration of Al in intermetallic layer 124 may be in a range from about 0.67 to about 1, in a range from about 0.67 to less than about 1, about 1, or greater than about 1. In some embodiments, the molar concentration of Al is lowered to reduce the reactivity of the intermetallic layer with the glass-based material that is shaped against the mold and the likelihood that the glass-based material that is shaped against the mold will stick to the mold. Depending on the composition of the glass-based material that is shaped against the mold, the ratio of the molar concentration of Ti to the molar concentration of Al in intermetallic layer 124 may be greater than 1 to increase the temperature the multi-layer coating can withstand. In some embodiments, the multi-layer coating may withstand temperatures of up to about 800° C. when the ratio of the molar concentration of Ti to the molar concentration of Al is in a range from about 0.67 to less than about 1. In some embodiments, the multi-layer coating may withstand temperatures of up to about 850° C. when the ratio of the molar concentration of Ti to the molar concentration of Al is about 1. In some embodiments, the sum of the molar concentrations of Ti and Al may be greater than or equal to the molar concentration of Zr. In some embodiments, the sum of the molar concentrations of Ti and Al may be greater than or equal to the molar concentration of Zr. The molar concentration of the elements may be measured using an electron microprobe or XPS.

In some embodiments, intermetallic layer 124 may be a gradient layer wherein the amount of additional metal and/or the amount of Ti and Al changes through the thickness of the layer. In some embodiments, intermetallic layer 124 may have a change in the additional metal content with a lower molar content of the additional metal in a portion of the intermetallic layer closest to diffusion barrier layer 122 and a higher molar content of the additional metal in a portion of the intermetallic layer farthest from diffusion barrier layer 122. In some embodiments, the change in the additional metal content may change continuously through the thickness of intermetallic layer 124. In some embodiments, the change in additional metal content may change discontinuously through the thickness of intermetallic layer 124. The change in the amount of additional metal may be useful when there is a difference in the coefficient of thermal expansion (CTE) between diffusion barrier layer 122 and the additional metal of intermetallic layer 124. In some embodiments, intermetallic layer 124 may have a change in Ti and Al content with a higher molar Ti and Al content in a portion of the intermetallic layer closest to diffusion barrier layer 122 and a lower molar Ti and Al content in a portion of the intermetallic layer farthest from diffusion barrier layer 122. In some embodiments, the change in Ti and Al content may change continuously through the thickness of intermetallic layer 124. In some embodiments, the change in Ti and Al content may change discontinuously through the thickness of intermetallic layer 124. In some embodiments, intermetallic layer 124 may have a thickness in a range from about 25 nm to about 2,000 nm, from about 100 nm to about 600 nm, from about 300 nm to about 500 nm, or from about 1,000 nm to about 2,000 nm.

Figure 2:
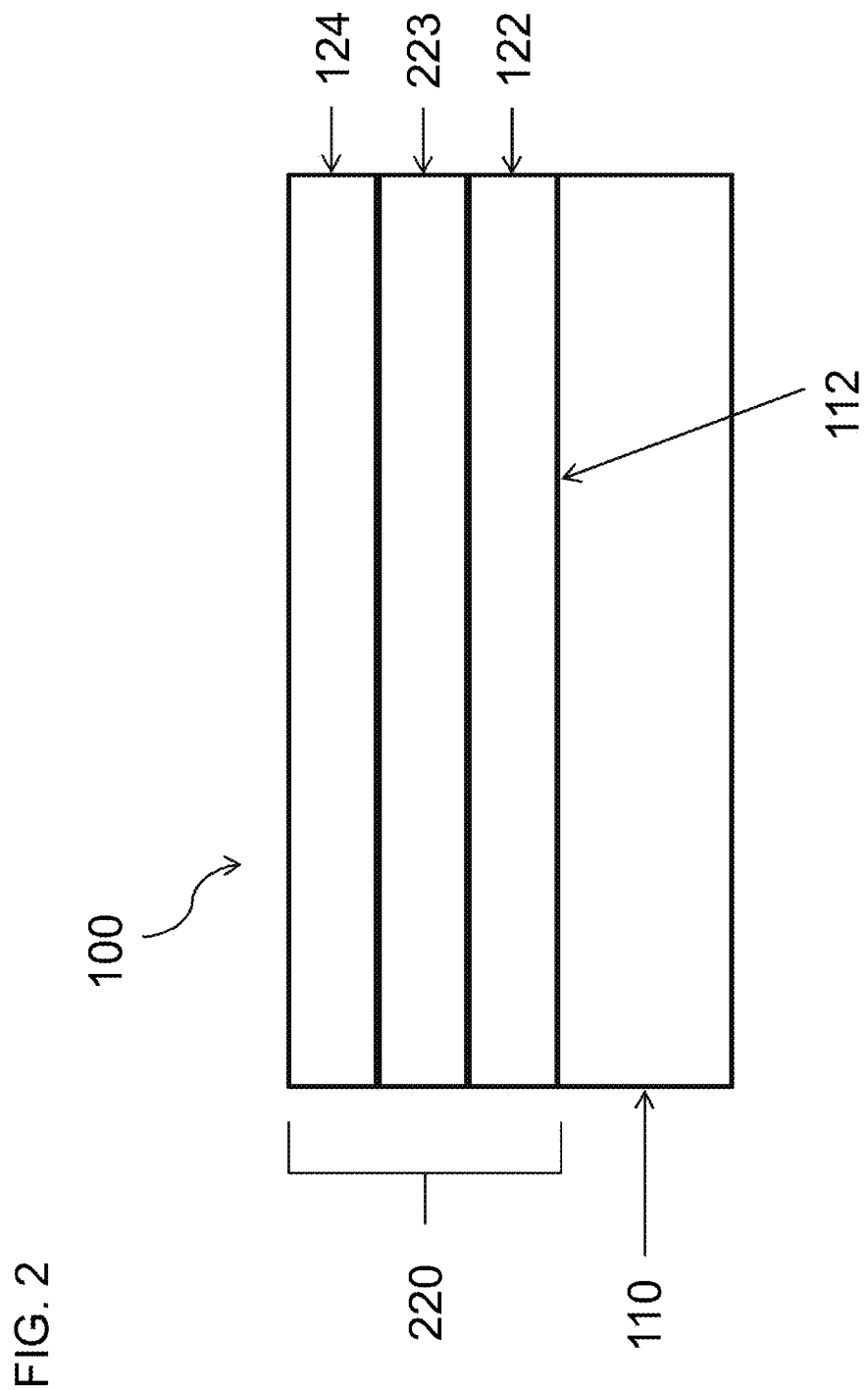
FIG. 2. schematically depicts a cross sectional diagram of a multi-layer coating on a mold body, according to one or more embodiments shown and described herein.

In some embodiments, as shown for example in FIG. 2, a multi-layer coating 220 may include a transition layer 223 between diffusion barrier layer 122 and intermetallic layer 124 such that diffusion barrier layer 122 may be disposed on mold body 110, transition layer 223 may be disposed on diffusion barrier layer 122 and intermetallic layer 124 may be disposed on transition layer 223. The multi-layer coating 220 of FIG. 2 is similar to the multi-layer coating 120 of FIG. 1, except that it adds transition layer 223. The characteristics of diffusion barrier layer 122 and intermetallic layer 124 are the same as described above with respect to FIG. 1 unless otherwise noted. In some embodiments, the transition layer may include the same components as the diffusion barrier layer 122 except that transition layer 223 includes a gradient-reduced nitrogen. Specifically, there may be a higher molar nitrogen content in the portion of the transition layer 223 closest to diffusion barrier layer 122 and lower or no molar nitrogen content in the portion of transition layer 223 closest to intermetallic layer 124. For example, the part of transition layer 223 nearest diffusion barrier layer 122 may be a nitride, such as TiAlN. On the side of transition layer 223 closest to intermetallic layer 124, there may be less or no nitrogen present. For example, in the portion nearest intermetallic layer 124, transition layer 223 may include mostly TiAl, or oxides thereof, and in the portion nearest diffusion barrier layer 122, transition layer 223 may include mostly TiAlN. In some embodiments, the portion of transition layer 223 in contact with diffusion barrier layer 122 may include at least about 20% molar nitrogen content and the portion of transition layer 223 closest to intermetallic layer 124 may not contain nitrogen. Without being bound by theory, it is believed that transition layer 223 may reduce the mechanical stress in multi-layer coating 120, especially as compared with a coating which has nitride and non-nitride layers in direct contact. Since different chemical species in the multi-layer coating 120 may have different CTEs, the mechanical stress between layers of the multi-layer coating 120 may be reduced by forming a layer that utilizes a gradient of a chemical species to reduce mechanical stress during heating or cooling. In some embodiments, transition layer 223 may include a molar nitrogen content of greater than about 30% at its surface nearest diffusion barrier layer 122 and a molar nitrogen content of less than about 30% at its surface nearest intermetallic layer 124. In another embodiment, transition layer 223 may include a molar nitrogen content of greater than about 35% at its surface nearest diffusion barrier layer 122 and a molar nitrogen content of less than about 25% at its surface nearest intermetallic layer 124. In yet another embodiment, transition layer 223 may a molar nitrogen content of greater than about 40% at its surface nearest the diffusion barrier layer 116 and a molar nitrogen content of less than about 20% at its surface nearest intermetallic layer 124. In some embodiments, the change in nitrogen content may change continuously through the thickness of transition layer 223. In some embodiments, the change in nitrogen content may change discontinuously through the thickness of transition layer 223. It should be understood that transition layer 223 is optional and that, in some embodiments, the multi-layer coating may be formed without the transition layer. In some embodiments, transition layer 223 may have a thickness in a range from about 25 nm to about 2,000 nm, from about 100 nm to about 800 nm, from about 200 nm to about 500 nm, or from about 800 nm to about 1,200 nm.

Figure 3:
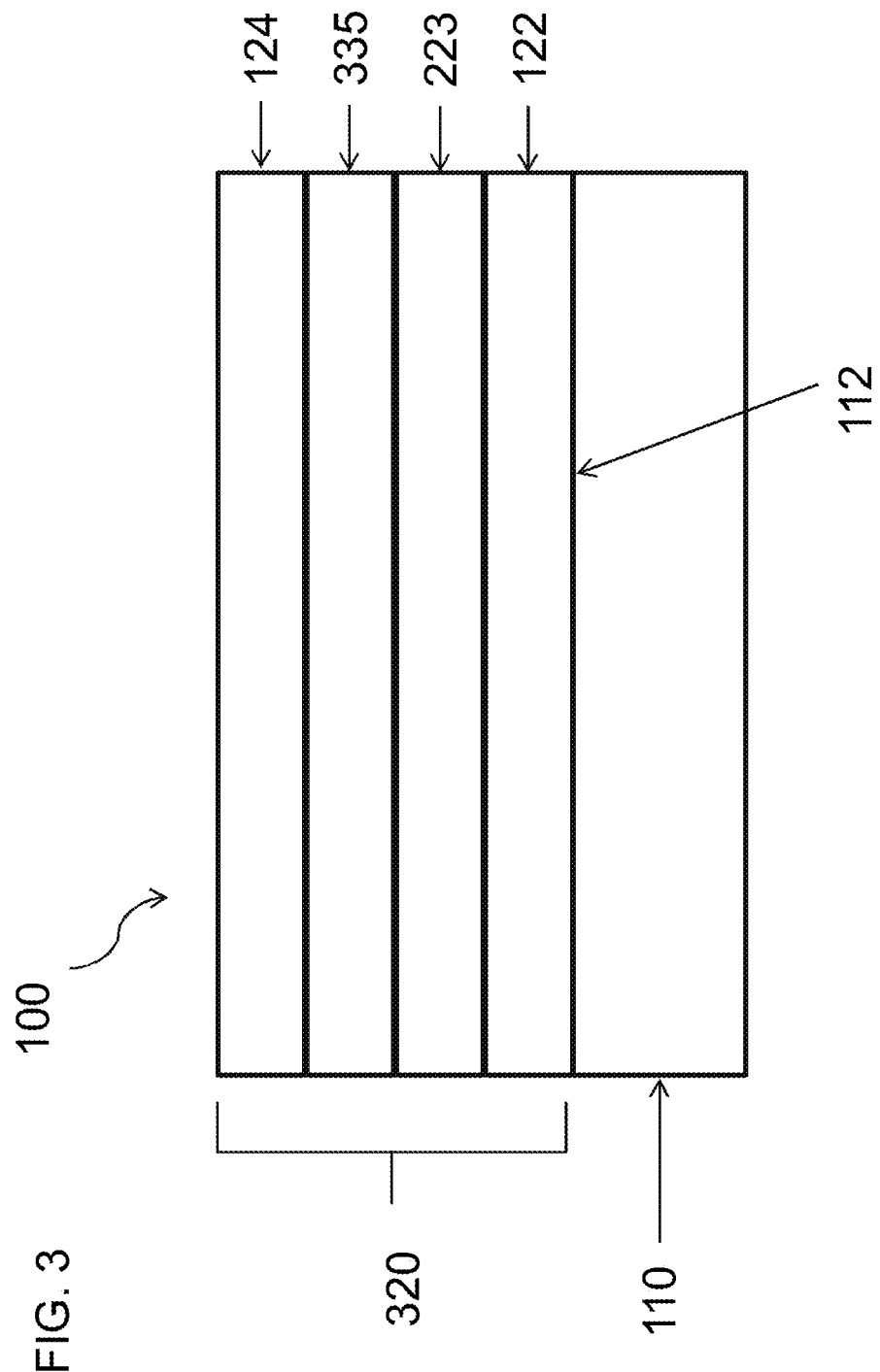
FIG. 3 schematically depicts a cross sectional diagram of a multi-layer coating on a mold body, according to one or more embodiments shown and described herein.
Figure 4A:
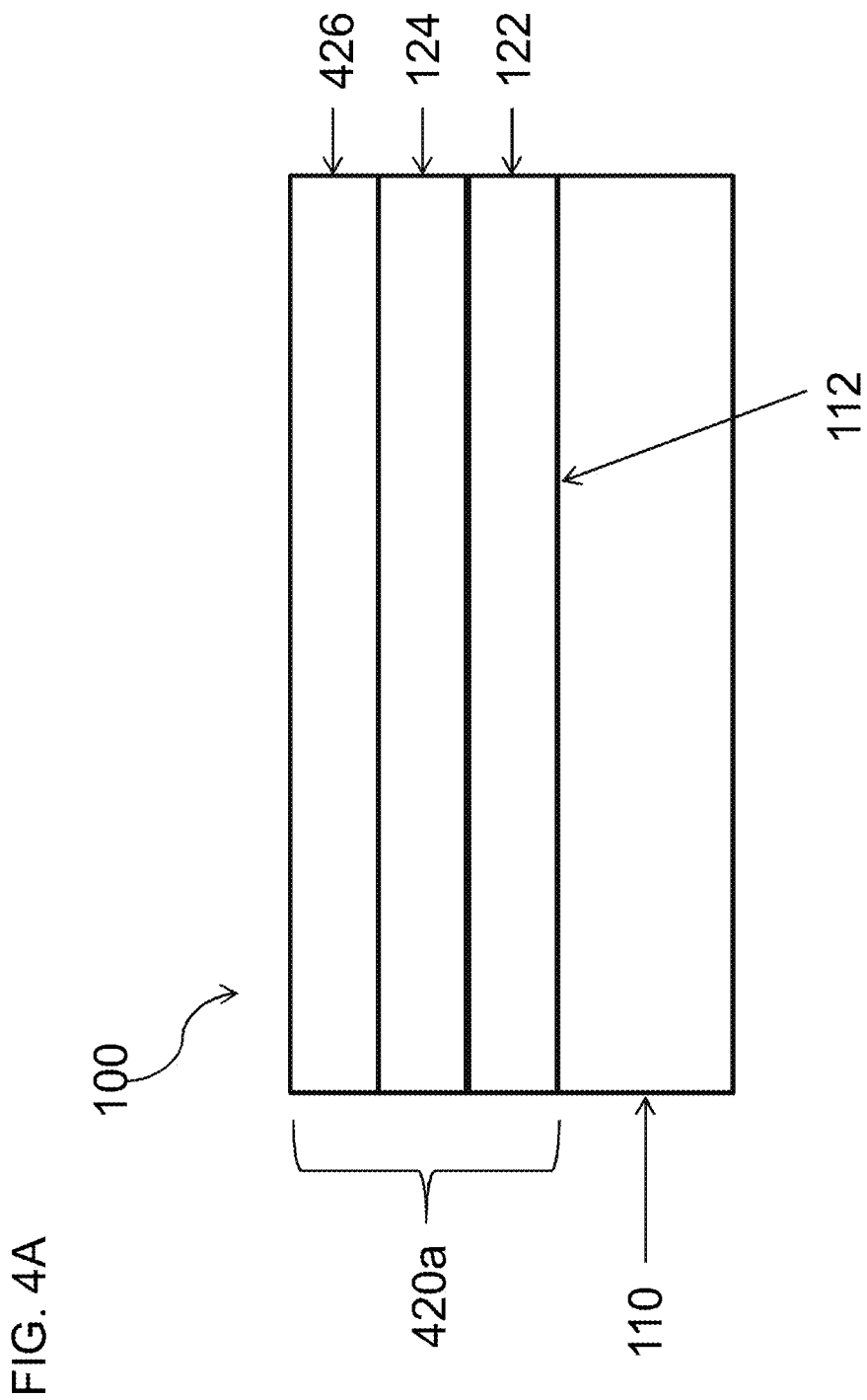
Figure 4C:
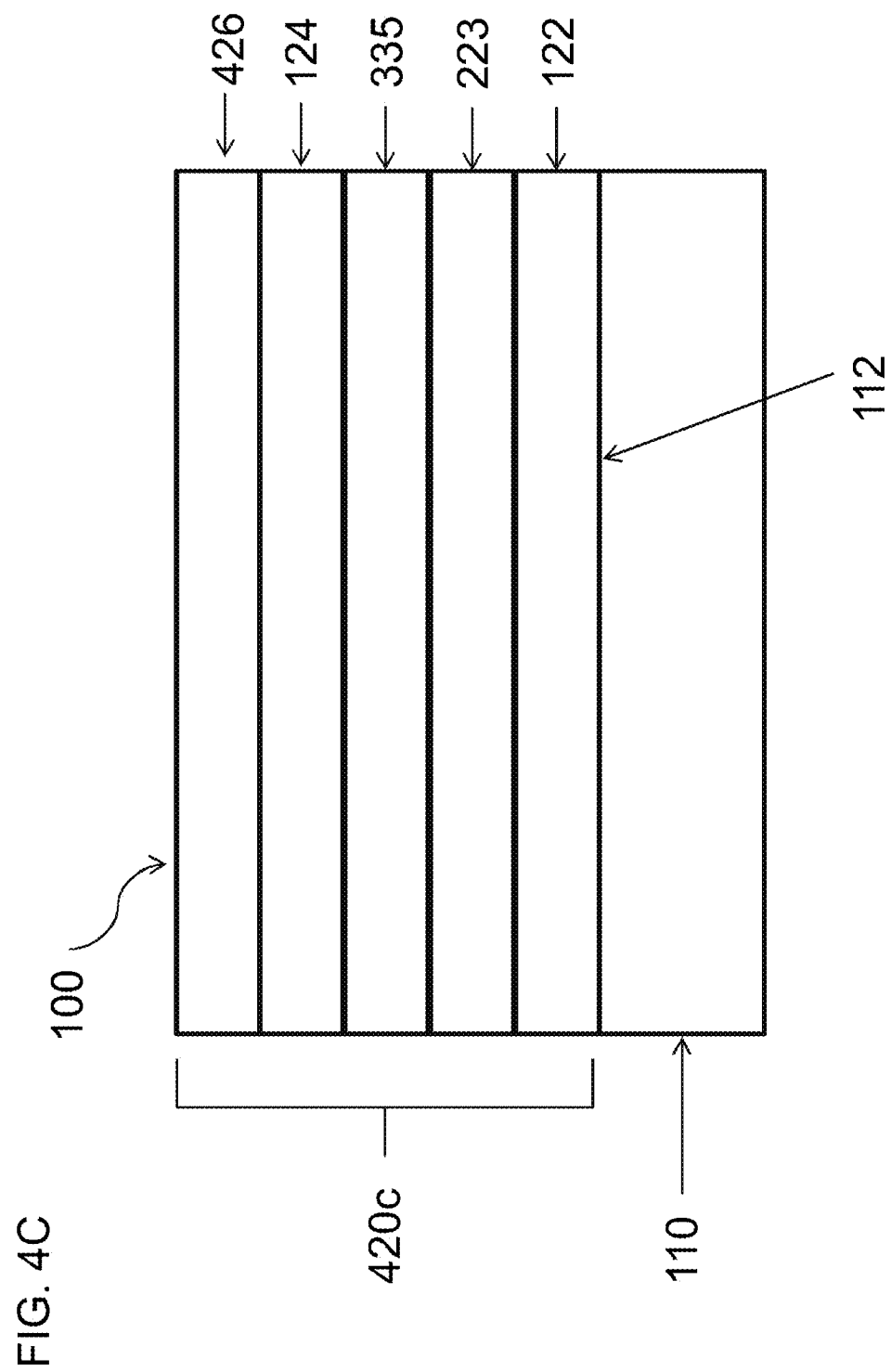

In some embodiments, as shown for example in FIG. 3, a multi-layer coating 320 may include a TiAl intermetallic layer 335 between transition layer 223 and intermetallic layer 124 such that diffusion layer 122 may be disposed on mold body 110, transition layer 223 may be disposed on diffusion barrier layer 122, TiAl intermetallic layer 335 may be disposed on transition layer 223, and intermetallic layer 124 may be disposed on TiAl intermetallic layer 335. In some embodiment, TiAl intermetallic layer 335 may include additional metals including, but not limited to Zr. The multi-layer coating 320 of FIG. 3 is similar to the multi-layer coating 220 of FIG. 2, except that it adds TiAl intermetallic layer 335. The characteristics of diffusion barrier layer 112, intermetallic layer 124, and transition layer 223 are the same as described above with respect to FIGS. 1 and 2 unless otherwise noted. In some embodiments, TiAl intermetallic layer 335 may have a thickness in a range from about 25 nm to about 2,000 nm, from about 100 nm to about 800 nm, from about 200 nm to about 500 nm, from about 500 nm to about 2,000 nm, or from about 500 nm to about 1,000 nm. In some embodiments, any of the multi-layer coatings previously described may have a metal layer 426 disposed on intermetallic layer 124. FIG. 4A illustrates a multi-layer coating 420*a* similar to multi-layer coating 120 of FIG. 1 except metal layer 426 is disposed on intermetallic layer 124. Similarly, FIG. 4B illustrates a multi-layer coating 420*b* similar to multi-layer coating 220 of FIG. 2 except metal layer 426 is disposed on intermetallic layer 124 and FIG. 4C illustrates a multi-layer coating 420*c* similar to multi-layer coating 320 of FIG. 3 except metal layer 426 is disposed on intermetallic layer 124. In some embodiments, metal layer 426 may include the additional metal of intermetallic layer 124. In some embodiments, refractory metal layer 426 may be included because it may be less reactive with the glass-based materials that are shaped against the mold, and therefore, reduces sticking of the glass-base materials to the mold during shaping and provides a shaped glass-based material with better surface cosmetics. Also, the metal layer 426 may be included because it may make the multi-layer coating more resistant to damage from high temperatures (for example, 760° C. to 900° C.), which the mold may need to withstand when forming glass-based materials having softening points at high temperatures. In some embodiments, metal layer 426 may have a thickness in a range from about 25 nm to about 2,000 nm, from about 100 nm to about 800 nm, from about 200 nm to about 500 nm, or from about 800 nm to about 1,200 nm.

Figure 5B:
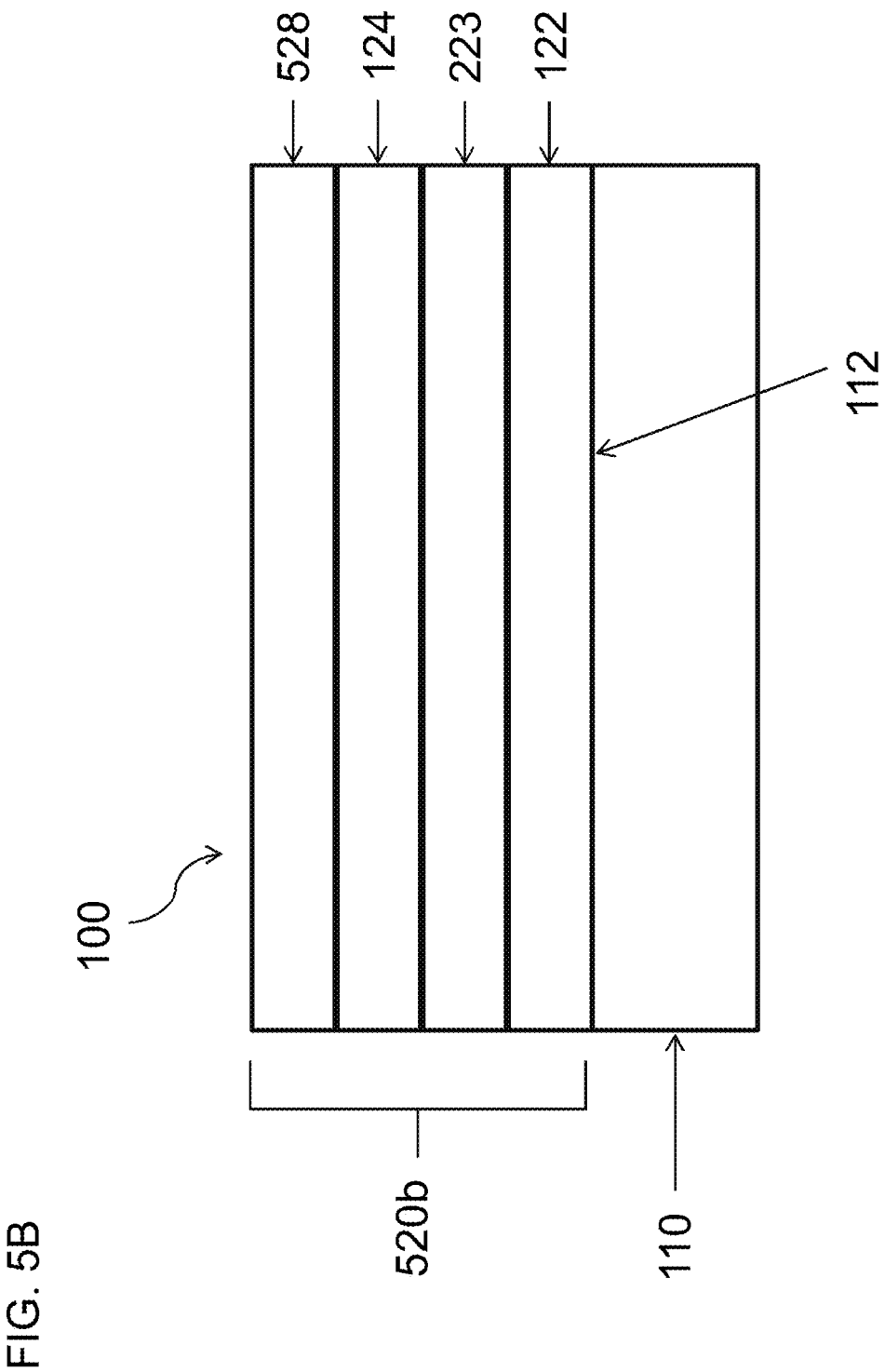
Figure 5D:
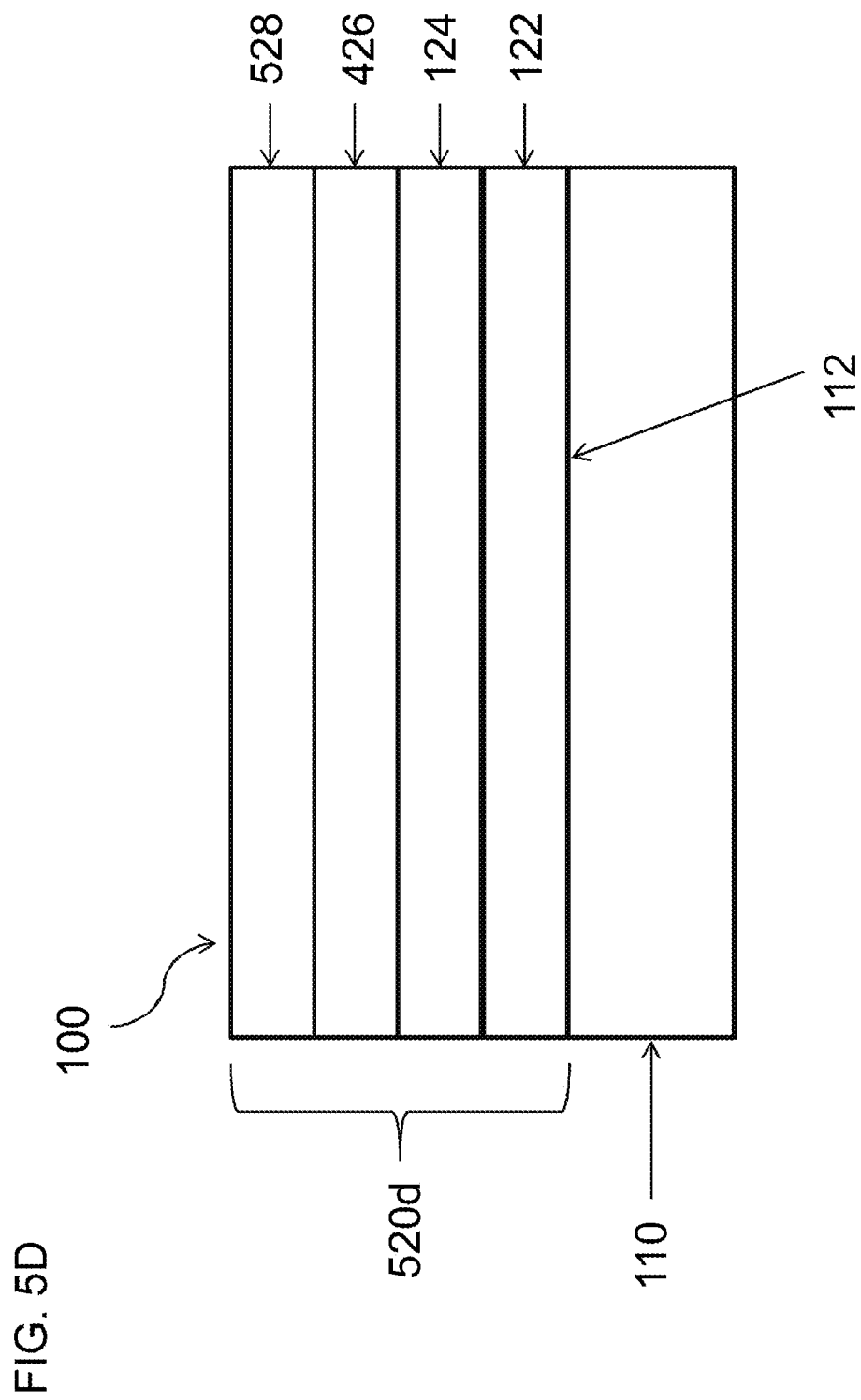
Figure 5F:
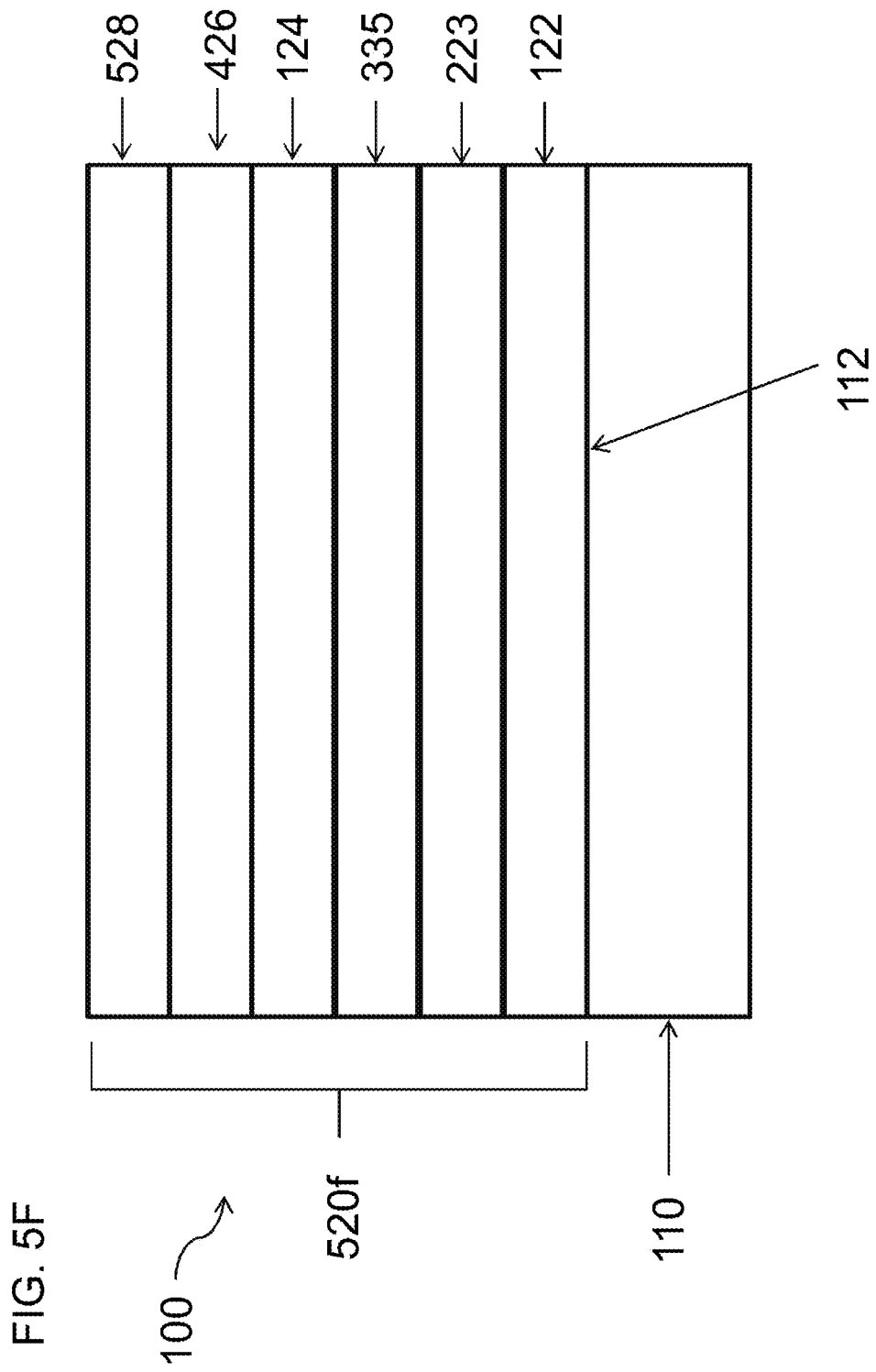

In some embodiments, any of the multi-layer coatings previously described may have an oxide layer 528 as the outermost layer of the multi-layer coating. FIG. 5A illustrates a multi-layer coating 520a similar to multi-layer coating 120 of FIG. 1 except oxide layer 528 is disposed on intermetallic layer 124. Similarly, FIG. 5B illustrates a multi-layer coating 520b similar to multi-layer coating 220 of FIG. 2 except oxide layer 528 is disposed on intermetallic layer 124; FIG. 5C illustrates a multi-layer coating 520c similar to multi-layer coating 320 of FIG. 3 except oxide layer 528 is disposed on intermetallic layer 124; FIG. 5D illustrates a multi-layer coating 520d similar to multi-layer coating 420a of FIG. 4A except oxide layer 528 is disposed on metal layer 426; FIG. 5E illustrates a multi-layer coating 520e similar to multi-layer coating 420b of FIG. 4B except oxide layer 528 is disposed on metal layer 426; and FIG. 5F illustrates a multi-layer coating 520f similar to multi-layer coating 420c of FIG. 4C except oxide layer 528 is disposed on metal layer 426. In some embodiments, oxide layer 528 is not a glass former, so the potential for glass sticking to the multi-layer coating is reduced. Also, oxide layer 582 may extend the service life of the multi-layer coating thereby improving the durability of the multi-layer coating.

In some embodiments, oxide layer 528 may be formed by oxidizing the outermost layer (e.g., intermetallic layer 124 or metal layer 426) of the multi-layer coating using conventional means such as heating. For example, in some embodiments, the mold may be heated to a temperature of at least about 500° C., at least about 600° C., at least about 700° C., or even at least about 750° C. For example, the coating may be heat treated by heating at a rate of 2° C./min from 20° C. to 750° C., holding at 750° C. for 30 min, and cooled to room temperature (i.e., about 25° C.) at furnace rate. As another example, an isothermal process may be used wherein the coating is oxidized by heat treating at a temperature of 750° C. for about 3 hours without any heat ramping. However, other heat treatments are contemplated herein, including but not limited to different temperature ramping rates and maximum heating temperatures and heating durations. In some embodiments, such as in coating stacks 520a, 520b, and 520c, oxide layer 528 may be an oxide containing the titanium, aluminum, and refractory metal from intermetallic layer 124 when oxide layer 528 is formed by oxidizing intermetallic layer 124. Thus, in some embodiments, oxide layer 528 may be a TiAlZr oxide In other embodiments, such as in coating stacks 520d, 520e, and 520f, oxide layer 528 may be an oxide of the metal of metal layer 426 when oxide layer 528 is formed by oxidizing metal layer 426. Thus, in some embodiments, oxide layer 528 may be zirconium oxide. In some embodiments, oxide layer 528 may have a thickness in a range from about 25 nm to about 2,000 nm, from about 100 nm to about 800 nm, from about 200 nm to about 500 nm, or from about 1,000 nm to about 2,000 nm.

In some embodiments, an adhesion layer (not shown) may be disposed between mold body 110 and diffusion barrier layer 122. However, in other embodiments, diffusion barrier layer 122 may be disposed directly on mold body 122 with an intervening layer. The adhesion layer may generally be a non-oxidized metal. For example, in embodiments, the adhesion layer may comprise TiAl, Al, Ti, or combinations thereof. The adhesion layer may provide enhanced adhesion between the mold body 110 and the diffusion barrier layer 122. Additionally, the adhesion layer may generally smooth the surface of the mold body 110, filling pits and other defects which may interfere with the deposition of at least the diffusion barrier layer 122. It should be understood that the adhesion layer is optional and that, in some embodiments, the multi-layer coatings may be formed without the adhesion layer.

Generally, a coated mold 100 may be prepared by depositing the various coating layers (except for oxide layer 528) onto mold body 110 using a deposition technique, such as physical vapor deposition (PVD). However, other known deposition techniques may be used. In some embodiments, a PVD preparation process may include PVD sputtering of layers of the multi-layer coating (for example with a Cemecon model CC800/9 ML 6(10) coater) at elevated temperatures (for example in a range from 250° C. to 650° C. or from 450° C. to 550° C.), high target power (greater than 2 kW), and at a substrate bias in a range from 50V to 150V. In some embodiments, when intermetallic layer 124 is a gradient layer there may be one or more TiAl sputter targets and one or more sputter targets of the additional metal (for example, Zr, Ta, Nb, Y, Mo, Hf, and combinations thereof) and the gradient may be created by adjusting the power to the appropriate targets to get the desired gradient. In some embodiments, the gradient-reduced nitrogen of transition layer 223 may be created by reducing the flow rate of nitrogen into the PVD coater, for example by decreasing the rate at a linear rate for about 10 minutes.

Following the layer deposition, the coated mold may be heat treated for a time and at a temperature sufficient to oxidize at least a portion of the multi-layer coating, such as, for example, heated to a temperature of at least about 500° C., at least about 600° C., at least about 700° C., or even at least about 750° C. For example, the coating may be heat treated by heating at a rate of 2° C./min from 20° C. to 750° C., holding at 750° C. for 30 min, and cooled to room temperature (i.e., about 25° C.) at furnace rate. However, other temperature ramping rates and maximum heating temperatures are contemplated herein. In one embodiment, the multi-layer coating is heat treated by exposure to elevated temperatures in a heating device, such as an oven or kiln. In another embodiment, the multi-layer coating may be heat treated by direct exposure to glass at an elevated temperature, such as direct contact with the glass that is being molded. However, any suitable heating process may be performed.

EXAMPLES

The embodiments of the coatings for glass-based-shaping molds described herein will be further clarified by the following examples. The examples are illustrative in nature, and should not be understood to limit the subject matter of the present disclosure.

Example 1

Figure 6:
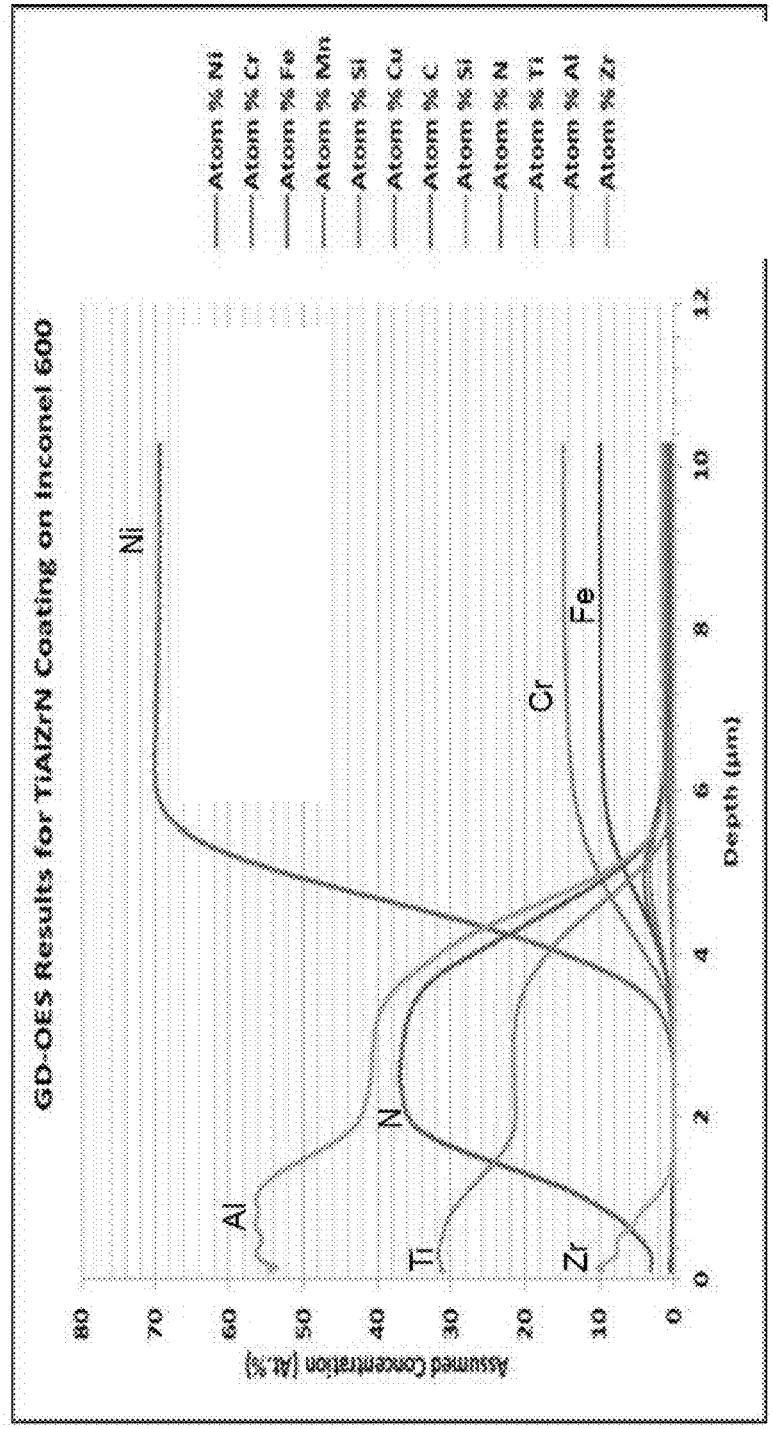
FIG. 6 is a plot of the atomic weight percentage vs. the depth of a coated mold for each element.
Figure 7:
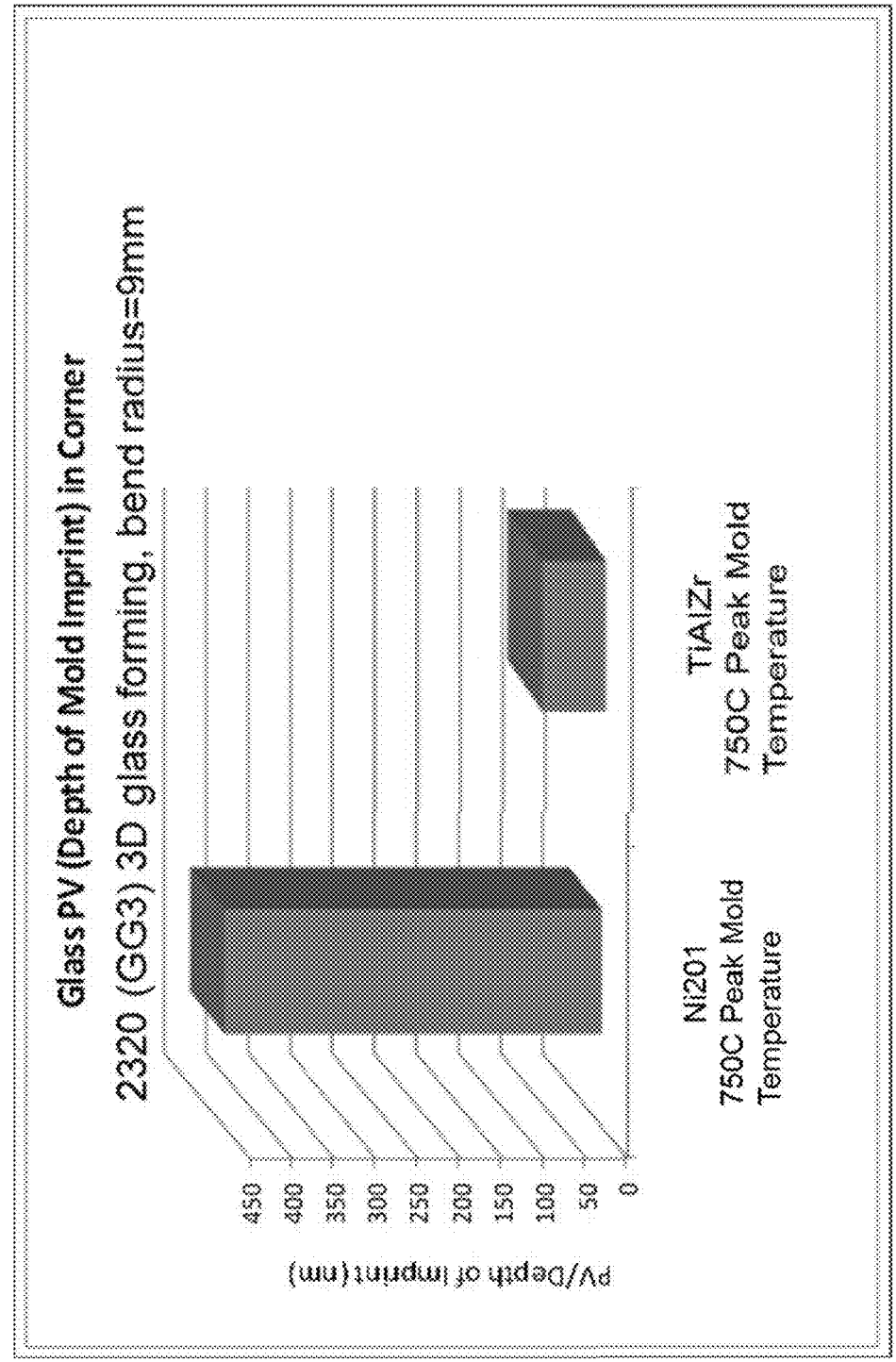
FIG. 7 is plot comparing the surface roughness of a glass sheet shaped with different molds.
Figure 8:
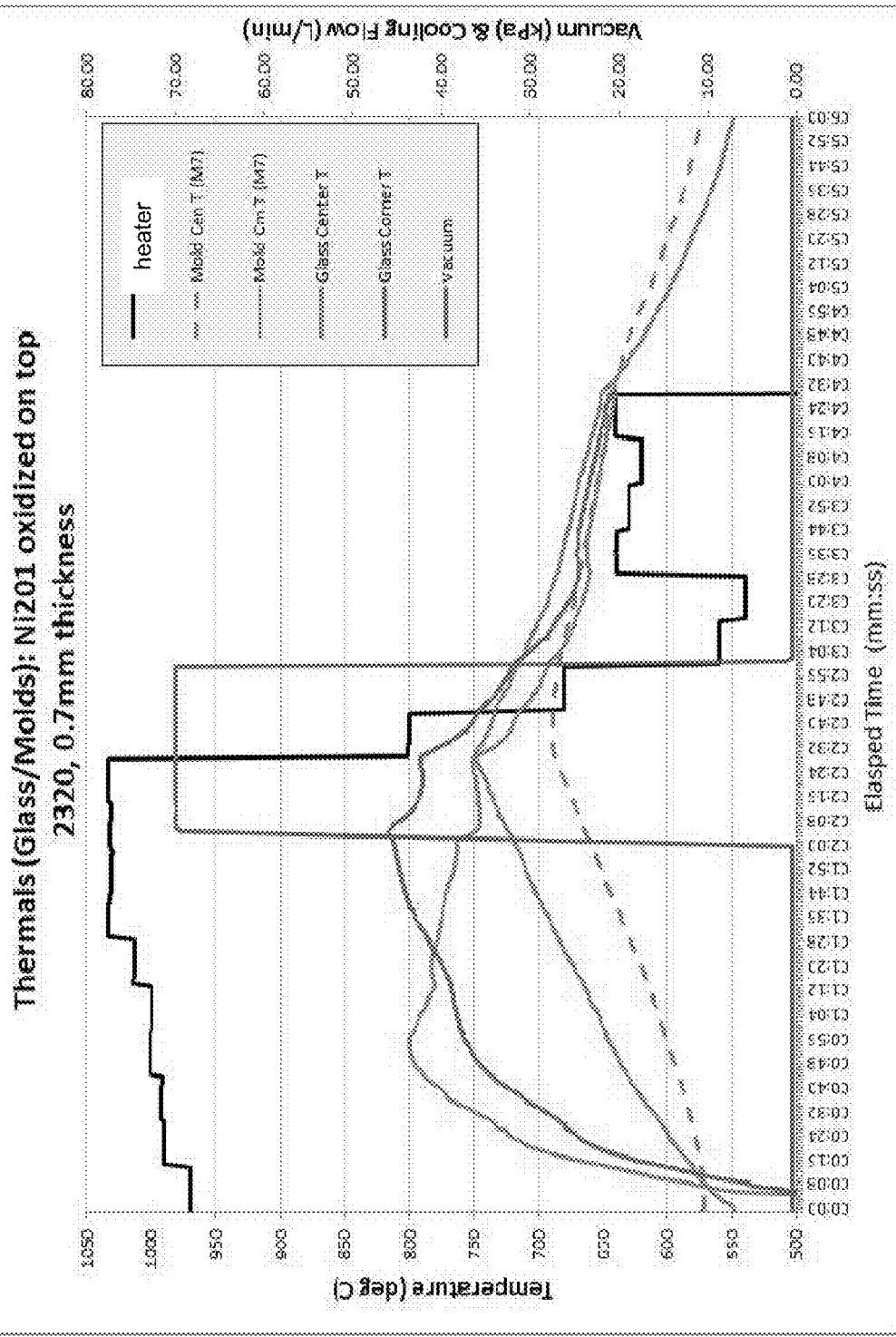
FIG. 8 is the exemplary thermal and vacuum profile of the glass and mold when shaping the glass on an nickel 201 mold discussed in Example 2.

A multi-layer coating was deposited on a mold substrate of Inconel 600 using a PVD coater available from Cemecon (Model No. CC800/9 ML 6(10)). Three TiAl sputter targets with a Ti/Al ratio of 1 and a power of 5 kW and 1 sputter target of pure zirconium with a power of 2.5 kW were used. The heater power was 2 kW and the chamber pressure was 550 mPa. First power was supplied only to the TiAl sputter targets for about 32 minutes in a nitrogen atmosphere to form a TiAlN layer. Then the flow rate of nitrogen was decreased at a linear rate to zero for about 10 minutes to create a transition layer with a gradient-reduced nitrogen content. During the last 30 seconds of the nitrogen ramp down, power to the Zr sputter target was ramped up to 0.5 kW. Then the power to the Zr sputter target was increased at a linear rate for about 3 minutes to a power of 2.5 kW to form a TiAlZr intermetallic layer. FIG. 6 is a plot of the assumed concentration in atomic weight % based on targeted values vs. the depth of the mold with the multi-layer coating for each element (Ni, Cr, Fe, Mn, Si, Cu, c, Si, N, Ti, Al, Zr). The data from FIG. 6 is based on the as deposited layers prior to oxidizing the outermost layer and shows that (1) the diffusion barrier layer blocks diffusion of the metals from the base mold into the top layers of the multi-layer coating and (2) that the composition of the top layers of the multi-layer coating are deposited as described.

Example 2

0.7 mm thick sheets of Corning glass code 2320 were molded to have a bend radius of 9 mm using a nickel 201 mold and a coated Inconel 600 mold of Example 1. The nickel 201 mold had an outer layer of nickel oxide that was approximately 4 to 7 μm thick. The coated Inconel mold of Example 1 had an additional outermost oxide layer that was approximately 1 to 1.5 μm thick.

Figure 9:
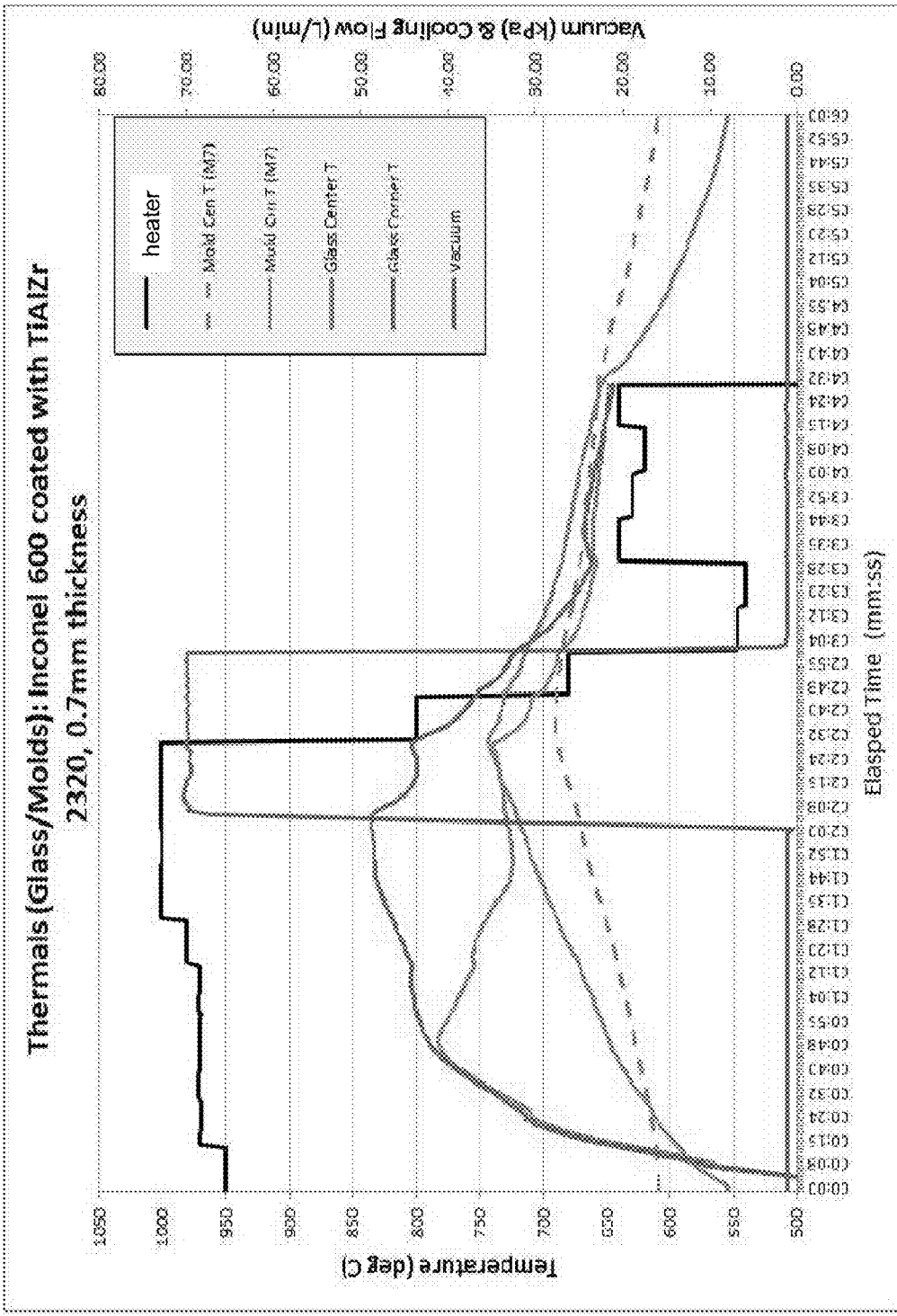
FIG. 9 is the exemplary thermal and vacuum profile of the glass and mold when shaping the glass on an Inconel 600 mold discussed in Example 2

The glass sheets shaped on the nickel 201 mold were placed on the mold and heat and vacuum were applied according to the profile shown in FIG. 9. The glass sheets shaped on the Inconel 600 mold were placed on the mold and heat and vacuum were applied according to the profile shown in FIG. 9.

After the glass sheets were molded, the peak to valley depth of the imprints of any pits on the surface of the molded glass sheets were measured using a Zygo optical profilometer. The peak to valley depths were averaged for the sheets molded on the nickel 201 mold and the sheets molded on the Inconel 600 mold. The peak mold temperature was temperature was 750° C. for both the nickel 201 and the Inconel 600 molds As can be seen in FIG. 10, the roughness of the glass sheet shaped using the nickel 201 mold is significantly higher than the glass sheets shaped using the coated Inconel 600 mold. Accordingly, the multi-layer coatings described herein minimize the imprints imparted on glass-based material from the mold as measured by the peak to valley depth of imprints formed in the shaped glass-based material. As a result, glass-based material shaped with molds having the multi-layer coatings described herein require less polishing to remove the imprints.

It should now be understood that the coatings disclosed herein may offer the advantage of reduced stickiness between the mold and the glass-based material, thus reducing or wholly eliminating cosmetic defects in molded glass-based material, such as stains, pitting, and scuffing. The coatings described herein may also have enhanced durability, and may allow for extending mold life to at least 2,000 cycles before the coating must be stripped and reapplied to the mold.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

Various modifications and variations can be made to the embodiments described herein without departing from the scope of the claimed subject matter. Thus it is intended that the specification cover the modifications and variations of the various embodiments described herein provided such modification and variations come within the scope of the appended claims and their equivalents.

We claim:
1. A mold comprising:
a mold body having an outer surface and a multi-layer coating disposed on the outer surface, wherein the multi-layer coating comprises:
a diffusion barrier layer disposed on the outer surface of the mold body; and
an intermetallic layer disposed on the diffusion barrier layer, wherein the intermetallic layer comprises Ti, Al, and an additional metal selected from the group consisting of Zr, Ta, Nb, Y, Mo, Hf, and combinations thereof, wherein the intermetallic layer comprises a change in the additional metal content with a lower molar content of the additional metal in a portion of the intermetallic layer closest to the diffusion barrier layer and a higher molar content of the additional metal in a portion of the intermetallic layer farthest from the diffusion barrier layer, and
the diffusion barrier layer restricts diffusion of metal from the mold body to the intermetallic layer.
2. The mold of claim 1, further comprising a transition layer disposed between the diffusion barrier layer and the intermetallic layer, wherein the transition layer comprises a change in nitrogen content with a higher molar nitrogen content in a portion of the transition layer closest to the diffusion barrier layer and a lower molar nitrogen content in a portion of the transition layer closest to the intermetallic layer.
3. The mold of claim 1, further comprising an oxidized intermetallic layer disposed on the intermetallic layer.
4. The mold of claim 1, wherein the ratio of titanium molar content to aluminum molar content in the multi-layer coating is in a range from about 0.67 to about 1.
5. The mold of claim 4, wherein the ratio of titanium molar content to aluminum molar content in the multi-layer coating is about 1.
6. The mold of claim 4, wherein the ratio of titanium molar content to aluminum molar content in the multi-layer coating is greater than or equal to about 0.67 and less than about 1.
7. The mold of claim 1, wherein a sum of the molar concentration of titanium and aluminum in the intermetallic layer is greater than or equal to the molar concentration of the additional metal in the intermetallic layer.
8. The mold of claim 1, wherein a sum of the molar concentration of titanium and aluminum in the intermetallic layer is less than the molar concentration of the additional metal in the intermetallic layer.
9. The mold of claim 1, further comprising a metal layer comprising the additional metal of the intermetallic layer disposed on the intermetallic layer.
10. The mold of claim 9, wherein the intermetallic layer comprises a change in additional metal content with a lower molar content of the additional metal in a portion of the intermetallic layer closest to the diffusion barrier layer and a higher molar content of the additional metal in a portion of the intermetallic layer closest to the metal layer.
11. The mold of claim 9, further comprising an oxidized metal layer disposed on the metal layer.
12. The mold of claim 1, wherein the additional metal is zirconium.

13. The mold of claim 1, wherein the mold body is predominantly a metal selected from the group consisting of iron, nickel, chromium, copper, mixtures thereof, and alloys thereof.

\* \* \* \* \*